United States Patent
Nittala et al.

(10) Patent No.: US 11,443,919 B2
(45) Date of Patent: Sep. 13, 2022

(54) FILM FORMATION VIA PULSED RF PLASMA

(71) Applicant: Applied Materials, Inc., Santa Clara, CA (US)

(72) Inventors: Krishna Nittala, Sunnyvale, CA (US); Diwakar N. Kedlaya, San Jose, CA (US); Karthik Janakiraman, San Jose, CA (US); Yi Yang, San Jose, CA (US); Rui Cheng, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 216 days.

(21) Appl. No.: 16/785,331

(22) Filed: Feb. 7, 2020

(65) Prior Publication Data

US 2020/0258720 A1  Aug. 13, 2020

Related U.S. Application Data

(60) Provisional application No. 62/803,661, filed on Feb. 11, 2019.

(51) Int. Cl.
*H01L 21/02* (2006.01)
*C23C 16/515* (2006.01)
(Continued)

(52) U.S. Cl.
CPC ...... *H01J 37/32082* (2013.01); *C23C 16/505* (2013.01); *C23C 16/515* (2013.01); *H01J 37/3244* (2013.01); *H01L 21/0228* (2013.01); *H01L 21/02205* (2013.01); *H01L 21/02211* (2013.01); *H01L 21/02274* (2013.01); *H01J 2237/3321* (2013.01)

(58) Field of Classification Search
None
See application file for complete search history.

(56) References Cited

U.S. PATENT DOCUMENTS 5,242,530 A   9/1993  Batey et al.
5,648,293 A   7/1997  Hayama et al.
(Continued)

OTHER PUBLICATIONS

International Search Report and Written Opinion for International Application No. PCT/US2020/017284 dated Jun. 5, 2020.

*Primary Examiner* — Asok K Sarkar
(74) *Attorney, Agent, or Firm* — Patterson + Sheridan, LLP (57) ABSTRACT

Systems and methods of using pulsed RF plasma to form amorphous and microcrystalline films are discussed herein. Methods of forming films can include (a) forming a plasma in a process chamber from a film precursor and (b) pulsing an RF power source to cause a duty cycle on time ($T_{ON}$) of a duty cycle of a pulse generated by the RF power source to be less than about 20% of a total cycle time ($T_{TOT}$) of the duty cycle to form the film. The methods can further include (c) depositing a first film interlayer on a substrate in the process chamber; (d) subsequent to (c), purging the process chamber; and (e) subsequent to (d), introducing a hydrogen plasma to the process chamber. Further in the method, (b)-(e) are repeated to form a film. The film can have an in-film hydrogen content of less than about 10%.

16 Claims, 3 Drawing Sheets (51) Int. Cl.
　　　*H01J 37/32*　　　(2006.01)
　　　*C23C 16/505*　　　(2006.01)

(56) References Cited

U.S. PATENT DOCUMENTS

| | | |
|---|---|---|
| 6,287,990 B1 | 9/2001 | Cheung et al. |
| 7,745,346 B2 | 6/2010 | Hausmann et al. |
| 8,076,242 B2 | 12/2011 | Kim et al. |
| 8,110,493 B1 | 2/2012 | Subramonium et al. |
| 8,383,210 B2 | 2/2013 | Roca I Cabarrocas et al. |
| 8,877,617 B2 | 11/2014 | Wong et al. |
| 9,589,799 B2 | 3/2017 | Reddy et al. |
| 10,157,736 B2 | 12/2018 | van Schravendijk et al. |
| 2009/0090616 A1 | 4/2009 | Du et al. |
| 2012/0122302 A1* | 5/2012 | Weidman .......... H01L 21/02167 438/478 |
| 2017/0323803 A1* | 11/2017 | van Schravendijk ........................ H01J 37/32009 |
| 2018/0061628 A1* | 3/2018 | Ou ...................... H01L 21/3065 |
| 2018/0323038 A1 | 11/2018 | Valcore, Jr. et al. |

\* cited by examiner

FILM FORMATION VIA PULSED RF PLASMA

CROSS-REFERENCE TO RELATED APPLICATIONS

This application claims benefit of U.S. provisional patent application Ser. No. 62/803,661, filed Feb. 11, 2019, which is incorporated herein by reference in its entirety.

BACKGROUND

Field

The implementations of the disclosure generally relate to the deposition of thin films on substrates such semiconductor substrates and hardware components.

Description of the Related Art

Plasma-enhanced chemical vapor deposition (PECVD) can be used to form films including silicon and hydride films during semiconductor device fabrication. High hydrogen (H) content in such films can lead to integration issues when subsequent films are formed on top of the PECVD-formed films. The integration issues can include peeling and bubbling of the film and the migration of the hydrogen in the film to other layers. The deposition temperature can be modulated during PECVD deposition of thin films to change the hydrogen content of the film, but high deposition temperatures utilize an amount of energy that can exceed a thermal budget of a semiconductor fabrication operation.

Thus, there remains a need in the art for an improved method of forming thin films on semiconductor substrates and hardware components.

SUMMARY

Methods and systems for forming films using RF pulsed plasma are discussed herein. In one aspect, a method of forming a film includes ionizing a precursor to form a plasma in a process volume of a process chamber and pulsing an RF power source coupled to the process chamber. In response to the pulsing of the RF power, depositing a film on a substrate during the pulsing of the RF power source, the substrate being positioned on a substrate support inside of the process volume, wherein the film includes a hydrogen content below about 10%.

Implementations can include one or more of the following. The substrate support can be at a temperature from 350° C. to 450° C. during the depositing of the film. Introducing the precursor gas can include introducing the precursor gas via a gas distribution assembly opposite the substrate support, the gas distribution assembly being at a temperature from about 200° C. to about 350° C. during the depositing of the film. The film can be deposited at a deposition rate from 1 Å/s to 8 Å/s during the pulsing of the RF power source. Pulsing the RF power source can include having a duty cycle on time ($T_{ON}$) of the RF power source of less than about 20%. The precursor gas can include silicon (Si) or germanium (Ge). The precursor gas can include hydrogen. The precursor gas can include $C_2H_6$, $C_2H_2$, or $GeH_4$.

In another aspect, a method of forming a film includes introducing a precursor to a process volume of a process chamber, the process chamber having a chamber lid, a chamber bottom, and a sidewall extending therebetween and ionizing the precursor gas to form a plasma. An RF power source is pulsed to cause a duty cycle on time ($T_{ON}$) of a duty cycle of a pulse generated by the RF power source to be less than about 20% of a total cycle time ($T_{TOT}$) of the duty cycle and a film having a hydrogen content below about 10% is deposited.

Implementations can include one or more of the following. The duty cycle on time ($T_{ON}$) of a duty cycle of a pulse generated by the RF power source to be less than about 10% of a total cycle time ($T_{TOT}$) of the duty cycle. The film can include a hydrogen content below about 5%. The film can have a variation in thickness of less than about 6%. The film can be deposited on a substrate positioned on the substrate support in the process chamber. The film can be deposited on at least one of the chamber lid, the chamber bottom, and the sidewall of the process chamber. Deposition of the film can occur at a deposition rate from about 1 Å/min to about 10 Å/min.

In another aspect, a method of forming a film includes (a) forming a plasma in a process chamber from a film precursor and (b) pulsing an RF power source to cause a duty cycle on time ($T_{ON}$) of a duty cycle of a pulse generated by the RF power source to be less than about 20% of a total cycle time ($T_{TOT}$) of the duty cycle. The method further includes (c) depositing a first film interlayer on a substrate in the process chamber; (d) subsequent to (c), purging the process chamber; and (e) subsequent to (d), introducing a hydrogen plasma to the process chamber. Further in the method, (b)-(e) are repeated to form a film.

Implementations can include one or more of the following. The substrate can include at least one of a lid surface of the process chamber, a bottom surface of the process chamber, a sidewall of the process chamber, or a substrate positioned on a substrate support in the process chamber. The film deposition rate at (c) can be from about 1 Å/min to about 5 Å/min. A thickness of the first film interlayer can be from about 2 Å to about 50 Å. A thickness of the film can be from about 100 Å to about 500 Å.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, and may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure generally relates to substrate processing systems, and more particularly to apparatus and methods for depositing films using pulsed RF plasma. Certain details are set forth in the following description and in FIGS. 1-3 to provide a thorough understanding of various implementations of the disclosure. Other details describing well-known structures and systems often associated with optical detection and substrate positioning are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. Further implementations of the disclosure can be practiced without several of the details described below. In addition, the apparatus description described herein is illustrative and should not be construed or interpreted as limiting the scope of the implementations described herein.

Semiconductor devices can include silicon-, nitride-, and hydride-containing thin films. The same types of thin films can also be used to coat and protect the process chamber components in which the semiconductor devices are fabricated. The process chambers can be configured to perform operations including chemical vapor deposition (CVD), plasma-enhanced CVD (PECVD), atomic layer deposition (ALD), or physical vapor deposition (PVD). Thin film quality on substrates or on chamber components can be negatively impacted by in-film impurities such as high hydrogen content, for example, an in-film hydrogen content of 10% or more. If thin films are used to coat process chamber components, the poor film quality of the protective coating can lead to the protective coating flaking off and contaminating substrates positioned in the process chamber. In another example, when thin films are formed on substrates for semiconductor devices, poor film quality can result in challenges in downstream operations, scrap, or reduced device performance. High in-film hydrogen content can negatively impact film quality and overall device quality. For example, film layers subsequently formed over a poor quality film layer can experience adhesion or other quality issues including migration of the in-film hydrogen content. In other examples, the underlying layers over which a film is formed can also experience quality issues including migration of the in-film hydrogen content to the underlying layers.

Using the systems and methods discussed herein, an RF power source is pulsed during a plasma-enhanced chemical vapor deposition process (PECVD) during film formation on a substrate or a chamber component. The films formed can include amorphous silicon, amorphous carbon, or microcrystalline films of silicon or other material(s). In one example, pulsing the RF power source during film deposition forms films with a predetermined in-film hydrogen content. In one example, the in-film hydrogen content is under 10%, for example, in a range from about 1% to about 9%. In another example, the in-film hydrogen content is under 5%, for example, in a range from about 1% to about 4%. In still another example, the in-film hydrogen content is under 2%, for example, in a range from about 0.1% to about 1%. Each pulse of an RF power source includes a total time ($T_{TOT}$) that is the sum of an "on-time" when the RF power source is on ($T_{ON}$), and an "off-time" ($T_{OFF}$) when the power source is off. Each of $T_{ON}$ and $T_{OFF}$ can be defined as a percentage of a duty cycle where the sum of $T_{ON}$ and $T_{OFF}$ for each pulse is 100%. During PECVD film formation, a duty cycle of the pulses of RF power can be tuned such that the $T_{ON}$ portion of the duty cycle is less than 20%, 15%, 10%, or 5%. In one example, during PECVD film formation, a duty cycle of the pulses of RF power can be tuned such that the $T_{ON}$ portion of the duty cycle is less than 20%, for example, from about 1% to about 19%. In another example, during PECVD film formation, a duty cycle of the pulses of RF power can be tuned such that the $T_{ON}$ portion of the duty cycle is less than 15%, for example, from about 1% to about 14%. In yet another example, during PECVD film formation, a duty cycle of the pulses of RF power can be tuned such that the $T_{ON}$ portion of the duty cycle is less than 10%, for example, from about 1% to about 9%. In yet another example, during PECVD film formation, a duty cycle of the pulses of RF power can be tuned such that the $T_{ON}$ portion of the duty cycle is less than 5%, for example, from about 1% to about 4%. Not to be bound by theory, but it is believed that in-film hydrogen content can be further reduced by replacing helium dilution gas with hydrogen dilution gas.

In some examples, the substrate can be heated prior to and/or during pulsed RF plasma film deposition. The substrate can be heated using heat lamps configured around a substrate support on which the substrate is positioned. In another example, the substrate can be heated using heating elements included in the substrate support. In one example, pulsed RF plasma film deposition occurs while the substrate is at a temperature from 300° C. to 500° C., such as from 350° C. to 450° C. In one example, which can be combined with other examples, the pressure in the chamber during film deposition is at least 8 Torr, for example, from about 8 Torr to about 20 Torr, such as from about 8 Torr to about 15 Torr. Furthermore, film properties such as the refractive index (n), stress, and extinction coefficient (k) can be adjusted by varying the duty cycle of the pulsed RF plasma PECVD operations discussed herein.

In another example, a film is deposited in a cyclic process where plasma such as silane plasma is pulsed at a low deposition rate. The low deposition rate can be from about 1 Angstrom/min to about 5 Angstrom/min. The film can be deposited to a thickness of 20 angstrom (Å), 10 Å, 5 Å, or from about 3 Å to about 20 Å, such as about 5 Å to about 10 Å in the presence of helium, hydrogen, or combinations of gases. Subsequently, the film is exposed to hydrogen plasma for a predetermined time period. The deposition and hydrogen plasma exposure are repeated for one or more iterations to form a film with a target in-film hydrogen content, or refractive index (n), stress, and/or extinction coefficient (k).

Figure 1:
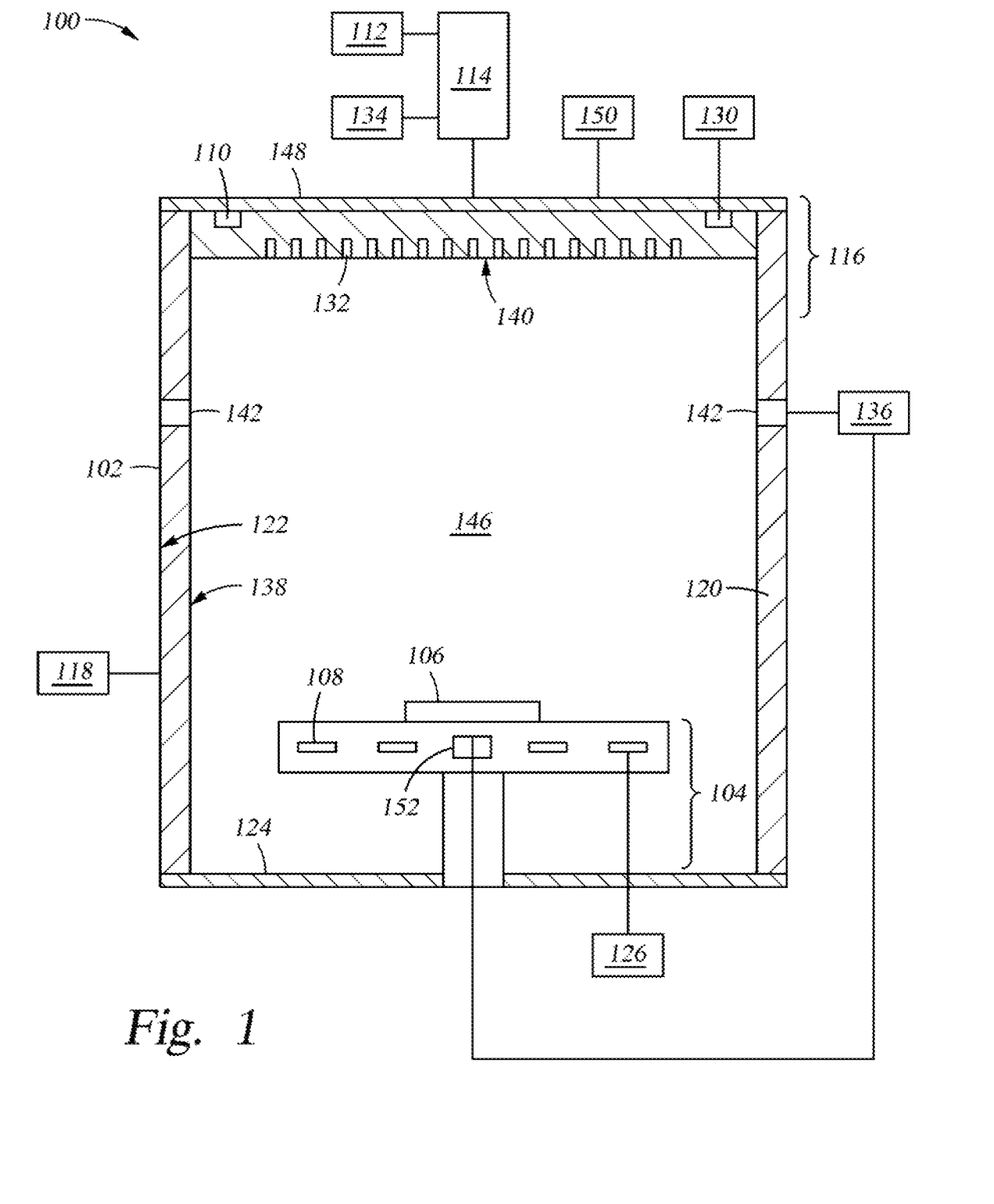
FIG. 1 is a schematic illustration of a substrate processing system according to implementations of the present disclosure.

FIG. 1 is a schematic illustration of a substrate processing system that includes a system 100, according to implementations of the present disclosure. The system 100 can be configured as a CVD system, including as a plasma-enhanced CVD (PECVD) system. The system 100 includes a process chamber 102 having a substrate support 104 disposed within a process volume 146 formed within the process chamber 102. The process chamber 102 includes a chamber sidewall 122, a chamber bottom 124, and a chamber lid 140 that define the process volume 146. The chamber lid 140 includes a gas distribution assembly 116 to facilitate distribution of process gases and/or plasma.

The system further includes a system controller 118 operable to control the automated aspects of the process chamber 102. The system controller 118 facilitates the control and automation of the overall process chamber 100 and may include a central processing unit (CPU), memory, and support circuits (or I/O). Software instructions and data can be coded and stored within the memory for instructing the CPU. The system controller 118 may communicate with one or more of the components of the process chamber 102 via, for example, a system bus. A program (or computer instructions) readable by the system controller 118 determines which tasks are performable on a substrate. In some implementations, the program is software readable by the system controller 118, which can include code to control pulses of the plasma source, gas flow, the sequence of movement of the various controlled components, and any combination thereof.

Although shown as a single system controller 118, it should be appreciated that multiple system controllers may be used with the implementations described herein. For example, in one implementation, a first controller controls the plasma source and a second controller controls chamber automation.

In some examples, the substrate support 104 is a substrate support pedestal. The substrate support 104 can include a mechanism that retains or supports a substrate 106 on top surface of the substrate support 104. The substrate 106 can be a semiconductor substrate that includes silicon and/or germanium. In some examples, the substrate 106 can have one or more layers formed thereon, including a metallic or dielectric layer. Examples of retention mechanisms may include an electrostatic chuck, a vacuum chuck, a substrate retaining clamp, or the like. The substrate support 104 can include mechanisms for controlling the substrate temperature (such as heating and/or cooling devices) and/or for controlling the species flux and/or ion energy proximate the substrate surface. The substrate support 104 includes one or more substrate support heating elements 108 disposed therein or otherwise thermally coupled to the substrate support 104. One or more power sources 126 are coupled to the one or more substrate support heating elements 108 to heat the substrate support 104 to a predetermined temperature, for example, while the substrate 106 is at a temperature from 300° C. to 500° C., such as from 350° C. to 450° C. In an implementation, the one or more power sources 126 are configured to provide at least 5 kW of energy. In alternate examples, the process chamber 102 can have one or more radiant heat lamps (not shown) positioned to illuminate the substrate 106 and/or the substrate support 104.

The gas distribution assembly 116 is disposed in the process chamber 102 opposite the substrate support 104. The gas distribution assembly 116 can be heated before and/or during one or more operations in the process chamber 102, such as a film deposition operation to a temperature from about 200° C. to about 350° C. The temperature of the gas distribution assembly 116 can be established prior to positioning the substrate 106 in the process chamber 102. The temperature of the gas distribution assembly 116 can be held or modified within a predetermined temperature range during the formation of one or more films in the process chamber 102. The elevated temperature of the gas distribution assembly 116 promotes gas flow into the process chamber 102 in part by reducing the temperature differential between the gas distribution assembly 116 and the substrate support 104 upon which the substrate 106 is positioned. In one example, the temperature of the gas distribution assembly 116 can be controlled by applying power from a power source 130 to a plurality of temperature control elements 110. In one example, the gas distribution assembly 116 can have the plurality of temperature control elements 110 disposed therein configured to create a temperature gradient and/or temperature zones across the gas distribution assembly 116. The plurality of temperature control elements 110 can be used to raise, lower, or maintain the temperature of the gas distribution assembly 116. In some examples, the gas distribution assembly 116 can be coupled to an RF source (not shown) configured to provide power to the gas distribution assembly before, during, and/or after operations within the process chamber 102.

The gas distribution assembly 116 further includes a plurality of apertures 132 formed through a faceplate of the gas distribution assembly 116. The gas introduced from a gas manifold 114 into the process chamber 102 is introduced to the process volume 146 via the plurality of apertures 132. The plurality of apertures 132 can be arranged in various configurations across the gas distribution assembly 116, which, as shown in FIG. 1, includes the chamber lid 140. In various examples, the plurality of apertures 132 can be arranged as concentric rings, ring clusters, randomly positioned clusters, or other geometric shapes. While each aperture of the plurality of apertures 132 is shown herein as being approximately the same diameter, it is contemplated that, in other examples, the diameter of the apertures 132 can vary. In some examples, the gas distribution assembly 116 includes zone heating such that the plurality of temperature control elements 110 can be controlled individually or in groups to create zones of varying temperatures across the chamber lid 140.

The gas distribution assembly 116 can be positioned in proximity to an optional chamber liner 120 such that the optional chamber liner 120 is flush with (in direct contact or with an adhesive disposed in therebetween) the gas distribution assembly 116. In examples where the optional chamber liner 120 is employed, the liner sidewall 138 is exposed to the process volume 146, the optional chamber liner thus protecting the chamber sidewall 122. In some implementations, the optional chamber liner 120 can be further disposed along the chamber bottom 124 (e.g., bottom surface) of the process chamber 102. Thus, the chamber sidewall 122 of the process chamber 102 can be protected by the optional chamber liner 120 from the process volume 146. One or more exhaust systems (not shown) can be coupled to the process chamber 102 and used to remove excess process gases or by-products from the process volume 146 during or after processing.

In one example, the gas distribution assembly 116 can be further coupled to a chiller plate 148. In one example, when the chiller plate 148 is coupled to the gas distribution assembly 116, the chiller plate 148 facilitates control over a temperature or a temperature gradient across the gas distribution assembly 116. In some implementations, the chiller plate 148 includes a plurality of channels (not shown) formed in the chiller plate 148. The plurality of channels allow a temperature control fluid provided by a temperature control fluid supply (chiller) 150 to flow through the chiller plate 148 to facilitate the control over the temperature of the gas distribution assembly 116.

As discussed herein, film deposition operations can include the formation of one or more films on the substrate 106 positioned on the substrate support 104 as well as the formation of one or more films on exposed surfaces of the process chamber 102. In one example, the one or more films formed inside of the process volume 146 can be formed on the chamber sidewall 122 (for example, when the optional chamber liner 120 is excluded). When the optional chamber liner 120 is used in the process chamber 102, the one or more films formed as discussed herein can be formed on the liner sidewall 138 instead of the chamber sidewall 122, since the chamber sidewall 122 is protected from the process volume 146 by the optional chamber liner 120.

One or more gas sources 112 are coupled to the process chamber 102 via the gas manifold 114. The gas manifold 114 is coupled to the gas distribution assembly 116 and is configured to deliver the one or more gases from the one or more gas sources 112 to the process volume 146. Each of the one or more gas sources 112 can contain a carrier gas, an ionizable gas (such as hydrogen or He) for plasma formation, or a precursor for film formation. An RF power source 136 can be electrically coupled to a chamber wall electrode 142 in the chamber sidewall 122. The RF power source 136 can be a 13.56 MHz RF power source. The RF power source 136 can be further electrically coupled to a substrate support electrode 152 disposed in the substrate support 104. Plasma can be generated in the process volume 146 via the RF power source 136. The RF power source 136 is a modulated power source configured to create an RF field using the chamber wall electrode 142 (which can be a positive electrode) and the substrate support electrode 152 (which can be a grounded electrode). The RF power source 136 can be pulsed during various operations. In some examples, a remote plasma source 134 can be used to deliver plasma to the process chamber 102 and can be coupled to the gas distribution assembly 116.

Figure 2:
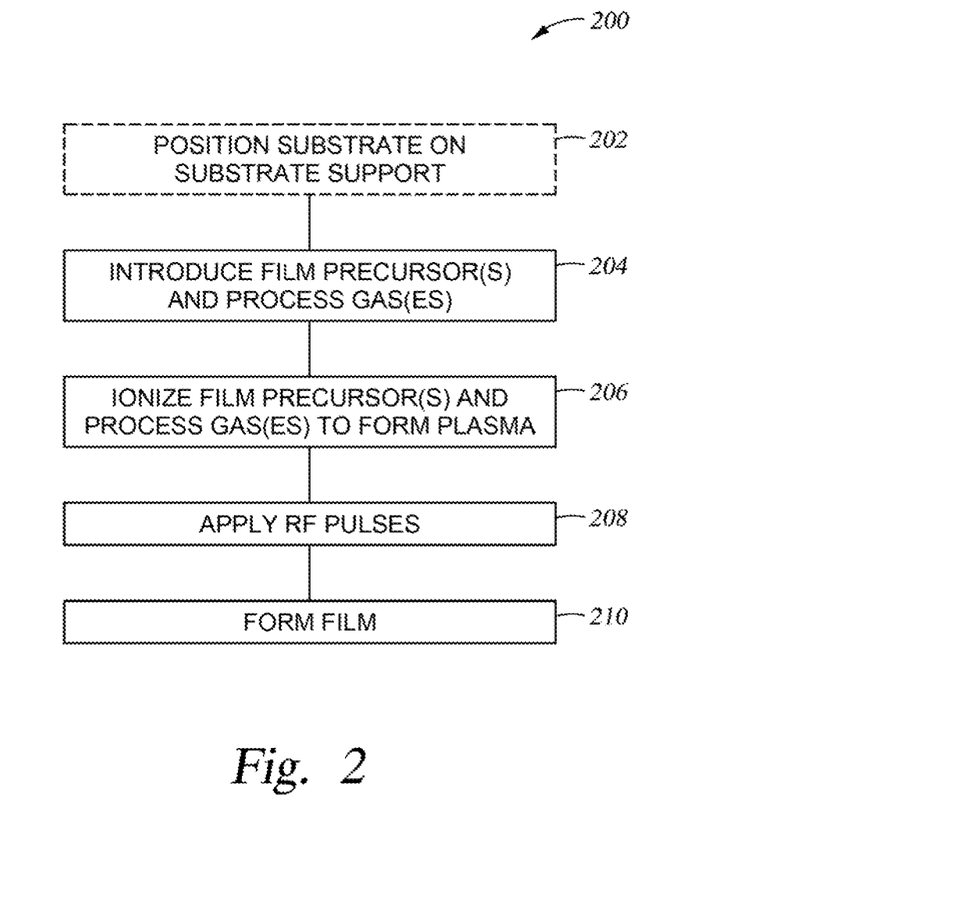
FIG. 2 is a flow chart of a method of forming films using pulsed RF plasma according to implementations of the present disclosure.

FIG. 2 is a flow chart of a method 200 of forming films using pulsed RF plasma. The method 200 can be employed to form one or more films on a substrate disposed on a substrate support in a process chamber 102, such as the process chamber 102 shown in FIG. 1. In this example of the method 200, at operation 202, a substrate such as the substrate 106 in FIG. 1 is positioned on a substrate support such as the substrate support 104. In another example, the method 200 can be employed to form one or more films inside of the process chamber 102 on substrates including the chamber sidewall 122, the chamber bottom 124, the chamber lid 140, and other exposed surfaces (e.g., to season one or more surfaces within the process chamber 102). As discussed above in FIG. 1, when the optional chamber liner 120 is employed, one or more films can be formed on the optional chamber liner 120. In one example, the method 200 is performed without a substrate positioned in the process chamber 102. In other examples, the method 200 is employed to form one or more films on both the substrate 106 positioned in the process chamber 102 and on one or more exposed surfaces of the process chamber 102.

At operation 204, one or more film precursor gases are introduced into the process chamber 102. The one or more film precursor gases can include silane ($SiH_4$), $Si_2H_6$, or other hydride or silicon-based precursors. In other examples, the one or more film precursor gases can include carbon-and-hydrogen containing compounds. For example, the one or more film precursor gases can include $C_2H_2$ or $C_3H_6$. In another example, the one or more film precursor gases can include germanium, such as $GeH_4$. In another example, the one or more film precursor gases can include arsenic (As) such as $AsH_3$. In one example, the one or more film precursor gases are introduced at operation 204 at a flow rate from about 100 sccm to about 1000 sccm. In one example, the one or more film precursor gases are introduced at operation 204 at a flow rate from about 300 sccm to about 800 sccm.

Further at operation 204, one or more process gases can be introduced into the process chamber 102. The one or more film precursor gases and process gases can be introduced at operation 204 via the gas distribution assembly 116 of FIG. 1. The one or more process gases can include argon (Ar), hydrogen, and/or helium (He). In one example, helium and argon are introduced to the process chamber 102 at operation 204 along with at least one film precursor gas. In another example, helium, hydrogen, and argon are introduced to the process chamber 102 at operation 204. In another example, hydrogen and argon are introduced to the process chamber 102 at operation 204. The helium can be introduced to the process chamber 102 at operation 204 at a flow rate from about 6500 sccm to about 8000 sccm. The argon can be introduced to the process chamber 102 at operation 204 at a flow rate from about 100 sccm to about 10,000 sccm. In one example, the hydrogen can be introduced to the process chamber 102 at operation 204 at a flow rate from about 100 sccm to about 1,000 sccm. In another example, the hydrogen can be introduced to the process chamber 102 at operation 204 at a flow rate from about 6,500 sccm to about 8,000 sccm. In one example, the ratio of the flow rate of helium to the flow rate of hydrogen is from about 4:1 to about 9:1. In another example, the ratio of the flow rate of helium to the flow rate of hydrogen is from about 5:1 to about 8:1. In some examples, there can be a target flow rate ratio between the one or more film precursor gases introduced at operation 204 and the one or more process gases introduced at operation 204. In one example, the ratio ($F_{PC}:F_G$) of the flow rate of the at least one film precursor gas ($F_{PC}$) to the flow rate of the process gases ($F_G$) is greater than 1:10.

In another example, hydrogen, argon, and helium are introduced to the process chamber 102 at operation 204. The hydrogen can be introduced to the process chamber 102 at operation 204 at a flow rate from about 6,500 sccm to about 8,000 sccm. The argon can be introduced to the process chamber 102 at operation 204 at a flow rate from about 100 sccm to about 10,000 sccm. The helium can be introduced to the process chamber 102 at operation 204 at a flow rate from about 100 sccm to about 1000 sccm. In one example, the ratio of the flow rate of hydrogen to the flow rate of helium is from about 4:1 to about 9:1. In another example, the ratio of the flow rate of hydrogen to the flow rate of helium is from about 5:1 to about 8:1.

In yet another example, hydrogen and argon are introduced to the process chamber 102 at operation 204. The hydrogen can be introduced to the process chamber 102 at operation 204 at a flow rate from about 6,500 sccm to about 8,000 sccm. The argon can be introduced to the process chamber 102 at operation 204 at a flow rate from about 100 sccm to about 10,000 sccm. In one example, the ratio of the flow rate of hydrogen to the flow rate of helium is from about 4:1 to about 9:1. In another example, the ratio of the flow rate of hydrogen to the flow rate of helium is from about 5:1 to about 8:1.

At operation 206, the one or more precursors and process gases are ionized to form plasma. At operation 208, an RF power source such as 136 in FIG. 1 is pulsed while the one or process gases and the one or more precursor gases are introduced into the process chamber. Each pulse at operation 208 has a total time $T_{TOT}$ for a duty cycle. The $T_{TOT}$ is the sum of a $T_{ON}$ and a $T_{OFF}$. In one example, the $T_{ON}$ at operation 208 is less than 30% of $T_{TOT}$, for example, from about 20% to about 29%. In another example, the $T_{ON}$ at operation 208 is less than 20% of $T_{TOT}$, for example from about 15% to about 19% of $T_{TOT}$. In another example, the $T_{ON}$ at operation 208 is less than 10% of $T_{TOT}$, for example from about 5% to about 9% of $T_{TOT}$. In an additional example, the $T_{ON}$ at operation 208 is less than 5% of $T_{TOT}$, for example from about 1% to about 4% of $T_{TOT}$.

Further, in the method 200, at least at operations 204, 206, and 208, a pressure in the process chamber 102 can be from about 1 mTorr to about 50 Torr. In another example, the pressure in the process chamber 102 during at least operations 204, 206, and 208 can be from about 8 Torr to about 50 Torr, for example from about 8 Torr to about 20 Torr. Furthermore, in the method 200, at least at operations 204, 206, and 208, a temperature in the process chamber 102 can be from about 300° C. to about 500° C. In other examples, at operations 204, 206, and 208, the temperature in the process chamber 102 can be from about 350° C. to about 450° C. The power density of a PECVD operation is the amount of power applied to the process chamber per unit volume of the process chamber. The peak power density is the highest value of the power density during process chamber operation. In one example, a peak power density during film deposition can be from 0.03 W/cm$^2$ to about 1.64 W/cm$^2$. In another example, a peak power density during film deposition is about 0.06 W/cm$^2$ or about 0.12 W/cm$^2$. In another example, a power density during the method 200 can be from about 0.03 W/cm$^2$ to about 1.64 W/cm$^2$. In some examples, the power density during the method 200 is from about 0.06 W/cm$^2$ to about 0.3 W/cm$^2$.

At operation 210 of the method 200, a film is formed. The film formed at operation 210 can be formed on the substrate 106 when operation 202 is performed. In other examples, the film formed at operation 210 can be formed on the lid, bottom, sidewall, or other exposed surfaces of the process chamber 102. Pulsing the plasma at operation 208 using RF power decreases the hydrogen concentration of the plasma in the process volume 146 and increases the rate of hydrogen desorption from the surface of the substrate 106 or exposed surface of the process chamber 102. The reduced desorption lowers the hydrogen content of the film formed at operation 210. The formation of the film from the film precursor at operation 210 occurs in response to the $T_{ON}$ periods of operation 208.

The film formed at operation 210 can be formed to have a thickness of up to about 500 Å. The film formed at operation 210 can include a hydrogen content of less than about 10%. In other examples, the film formed at operation 210 can include a hydrogen content of less than about 5%. In another example, the film formed at operation 210 can include a hydrogen content of less than about 3%. In another example, the film formed at operation 210 can include a hydrogen content of less than about 2%. In another example, the film formed at operation 210 can include a hydrogen content of less than about 1%. The film formed at operation 210 in response to the precursor gas introduction and pulsing of plasma can be deposited at a rate from about 10 Å/min to about 1,000 Å/min. In another example, the deposition rate can be from about 80 Å/min to about 300 Å/min. The film formed using the method 200 can be an amorphous film, such as a-Si, or a polycrystalline film. The film formed using the method 200 can have a refractive index from about 4.25 to about 4.45 at 633 nm. In another example, which can be combined with other examples herein, the film formed using the method 200 exhibits an extinction coefficient (k) from about 0.140 to about 0.180. In another example, that can be combined with other examples, the film formed using the method 200 has a k from about 0.140 to about 0.160. In another example, which can be combined with other examples herein, the film formed using the method 200 exhibits an in-film stress from about −1100 MPa to about −300 MPa. Further in an example of the method 200, which can be combined with other examples herein, a variation in the film thickness, which can also be referred to as the film uniformity, can be from less than about 1% to about 6%. In another example, which can be combined with other examples herein, the film uniformity is below about 4%.

Figure 3:
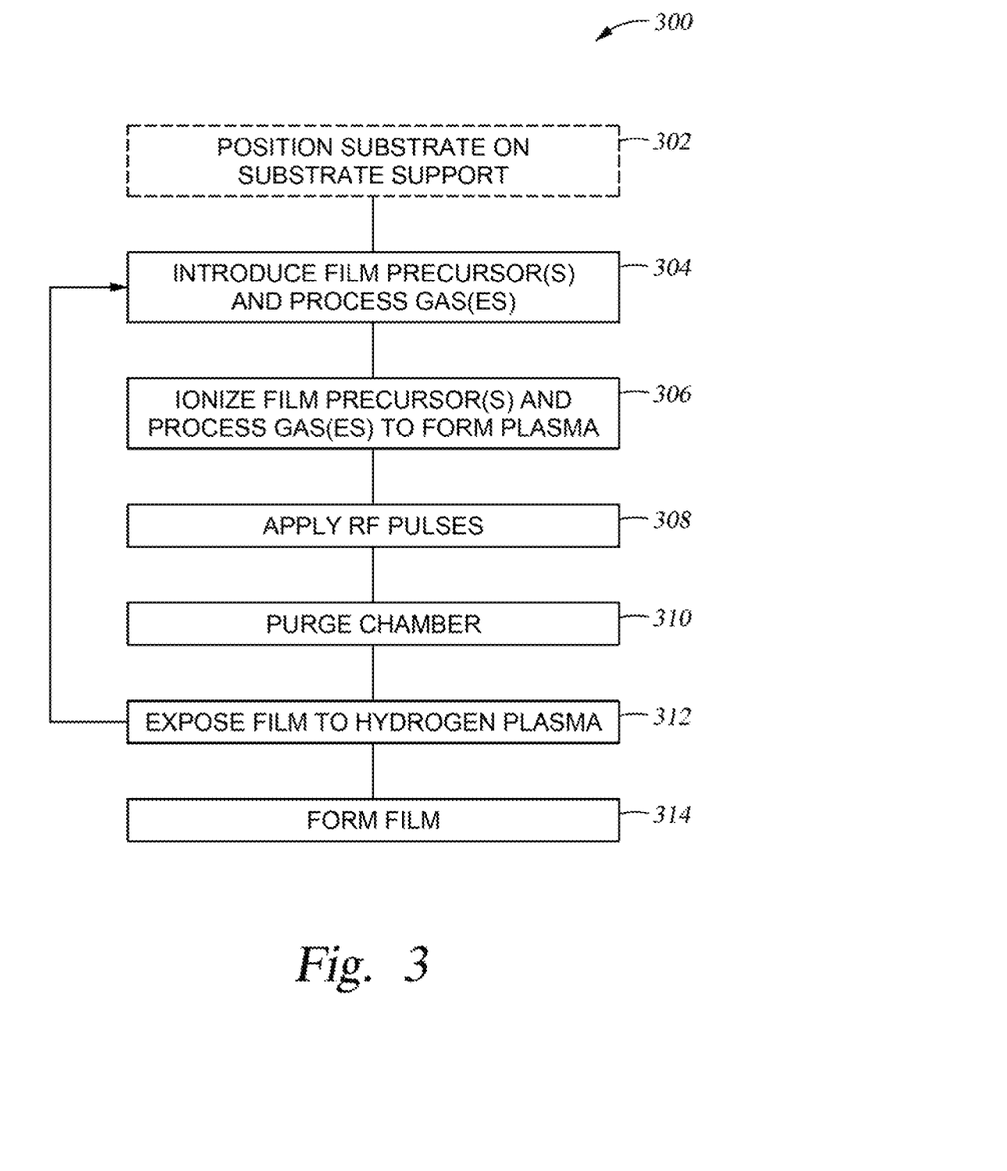
FIG. 3 is a flow chart of another method of forming films using pulsed RF plasma according to implementations of the present disclosure.

FIG. 3 is a flow chart of a method 300 of forming films using pulsed RF plasma. The method 300 is similar to the method 200, but the method 300 forms a film in a cyclic process. The method 300 can be employed to form one or more films on a substrate positioned on a substrate support in a process chamber, such as the process chamber 102 shown in FIG. 1. In this example of the method 300, at operation 302, a substrate such as the substrate 106 in FIG. 1 is positioned on a substrate support, for example, the substrate support 104 in FIG. 1. In another example, the method 300 can be employed to form one or more films on internal surfaces of the process chamber 102, for example, a seasoning process. During a seasoning process, the method 300 is performed without a substrate positioned in the process chamber 102. In other examples, the method 300 is employed to form one or more films on both a substrate 106 positioned in the process chamber 102 and on internal surfaces of the process chamber 102.

At operation 304, one or more film precursor gases are introduced to the process chamber. The one or more film precursor gases can include silane ($SiH_4$), $Si_2H_6$, or other carbon- or silicon-containing precursors. In other examples, the one or more film precursor gases can include $C_2H_2$ or $C_3H_6$. In another example, the one or more film precursor gases can include germanium, such as $GeH_4$. In another example, the one or more film precursor gases can include arsenic (As) such as $AsH_3$. In one example, the one or more film precursor gases are introduced at operation 304 at a flow rate from about 100 sccm to about 1,000 sccm.

Further at operation 304, one or more process gases can be introduced into the process chamber 102. The one or more film precursor gases and process gases can be introduced at operation 304 via the gas distribution assembly 116 of FIG. 1. The one or more process gases can include argon (Ar), hydrogen, and/or helium (He). In one example, helium and argon are introduced to the process chamber at operation 304 along with at least one film precursor gas. In another example, helium, hydrogen, and argon are all introduced to the process chamber at operation 304. In another example, hydrogen and argon are introduced to the process chamber at operation 304. The helium can be introduced to the process chamber at operation 304 at a flow rate from about 6,500 sccm to about 8,000 sccm. The argon can be introduced to the process chamber at operation 304 at a flow rate from about 100 sccm to about 10,000 sccm. The hydrogen can be introduced to the process chamber at operation 304 at a flow rate from about 100 sccm to about 1,000 sccm. In another example, the hydrogen can be introduced to the process chamber at operation 304 at a flow rate from about 6,500 sccm to about 8,000 sccm. In one example, the ratio of the flow rate of helium to the flow rate of hydrogen is from about 4:1 to about 9:1. In another example, the ratio of the flow rate of helium to the flow rate of hydrogen is from about 5:1 to about 8:1. In some examples, there can be a target flow rate ratio between the one or more film precursor gases introduced at operation 304 and the one or more process gases introduced at operation 304. In one example, the ratio ($F_{PC}$:$F_G$) of the flow rate of the at least one film precursor gas ($F_{PC}$) to the flow rate of the process gases ($F_G$) is greater than 1:10.

In another example, hydrogen, argon, and helium are introduced to the process chamber 102 at operation 304. The hydrogen can be introduced to the process chamber 102 at operation 304 at a flow rate from about 6,500 sccm to about 8,000 sccm. The argon can be introduced to the process chamber 102 at operation 304 at a flow rate from about 100 sccm to about 10,000 sccm. The helium can be introduced to the process chamber 102 at operation 304 at a flow rate from about 100 sccm to about 1,000 sccm. In one example, the ratio of the flow rate of hydrogen to the flow rate of helium is from about 4:1 to about 9:1. In another example, the ratio of the flow rate of hydrogen to the flow rate of helium is from about 5:1 to about 8:1.

In yet another example, hydrogen and argon are introduced to the process chamber 102 at operation 304. The hydrogen can be introduced to the process chamber 102 at operation 304 at a flow rate from about 6,500 sccm to about 8,000 sccm. The argon can be introduced to the process chamber 102 at operation 304 at a flow rate from about 100 sccm to about 10,000 sccm. In one example, the ratio of the flow rate of hydrogen to the flow rate of helium is from about 4:1 to about 9:1. In another example, the ratio of the flow rate of hydrogen to the flow rate of helium is from about 5:1 to about 8:1.

At operation 306, the one or more film precursor gases are ionized into plasma. At operation 308, an RF power source such as 136 in FIG. 1 is pulsed to deposit a first film interlayer, for example, a sub-portion of a film. The first film interlayer can be deposited at operation 308 on a substrate 106. In another example, the first film interlayer can be deposited at operation 308 on one or more interior surfaces of the process chamber 102. During operation 308, process gases including argon (Ar) and helium (He) can be present in the process chamber and ionized into plasma. In one example, hydrogen is not present in the process chamber 102 during operation 308. In other examples, hydrogen plasma is present in the process chamber 102 during operation 308.

The first film interlayer formed at operation 308 can be deposited at a rate from about 1 Å/min to about 10 Å/min, such as at a rate from about 2 Å/min to about 5 Å/min. Pulsing the plasma at operation 308 using RF power decreases the hydrogen plasma concentration in the process volume and increases the rate of hydrogen desorption from the surface, lowering the hydrogen content of each film interlayer to within a predetermined range or less than a predetermined maximum. As discussed above, each pulse of RF power at operation 308 has a total time $T_{TOT}$ for a duty cycle that is the sum of a $T_{ON}$ and a $T_{OFF}$. In one example, the $T_{ON}$ at operation 308 is less than 30% of $T_{TOT}$, for example, from about 20% to about 29%. In one example, the $T_{ON}$ at operation 308 is less than 20% of $T_{TOT}$, for example from about 15% to about 19% of $T_{TOT}$. In one example, the $T_{ON}$ at operation 308 is less than 10% of $T_{TOT}$ for example from about 5% to about 9% of $T_{TOT}$. In still another example, the $T_{ON}$ at operation 308 is less than 5% of $T_{TOT}$, for example from about 1% to about 4% of $T_{TOT}$. The deposition of the film interlayer from the film precursor occurs during the $T_{ON}$ periods of operation 308.

Further in the method 300, during one or more of operations 304, 306, and 308, a pressure in the process chamber 102 can be from about 1 mTorr to about 50 Torr. In another example, the pressure in the process chamber 102 during one or more of operations 304, 306, and 308 can be from about 8 Torr to about 50 Torr, for example, from about 8 Torr to about 20 Torr. Furthermore, in the method 300, during one or more of operations 304, 306, and 208, a temperature in the process chamber 102 can be from about 300° C. to about 500° C. In other examples, at one or more of operations 304, 306, and 308, the temperature in the process chamber 102 can be from about 300° C. to about 500° C. In yet other examples, at one or more of operations 304, 306, and 308, the temperature in the process chamber 102 can be from about 350° C. to about 450° C. A power density during the method 300 can be from about 0.03 W/cm² to about 1.64 W/cm². In some examples, the power density during the method 300 is from about 0.06 W/cm² to about 0.3 W/cm².

At operation 310, the process chamber 102 is optionally purged to remove the precursor plasma. In some examples, no purge is performed. In another example, a carrier and/or purge gas is continuously flowed such that a plasma remains ignited in the chamber and a precursor gas flow is ceased to remove it from the chamber. In an example where no purging is performed, hydrogen plasma can be present during at least operations 306 and 308. Further, in this example, the method 300 can proceed to operation 312 from operation 308. At operation 312, hydrogen plasma is formed and/or maintained in the process chamber 102 and the first film interlayer formed at operation 308 is exposed to the hydrogen plasma.

At operation 314 of the method 300, a film is formed from the one or more interlayers deposited in one or more iterations of operations 304, 306, 308, 310, and 312. A total thickness of the interlayers formed through these iterations can be up to about 50 Å. Each interlayer formed through each cycle can have a thickness from about 2 Å to about 49 Å. The film formed at operation 314 through the one or more iterations of operations 304, 306, 308, 310, and 312 can include a hydrogen content of less than about 10%, such as less than about 5%, or less than about 3%, or less than about 2%, such as less than about 1%. The film formed at operation 314 can be formed on interior surfaces of the process chamber. In another example, which can be combined with other examples, the film can be formed on a substrate 106 positioned in the process chamber 102. In one example, a film formed at operation 314 can have a microcrystalline grain structure.

As such, using the systems and methods discussed herein, pulsed RF plasma is used alone or in combination with H-plasma exposure to deposit a film. The films deposited herein can be formed on substrates and/or on chamber components, or other exposed surfaces. The pulsed RF plasma can include one or more semiconductor film precursors, and the plasma can be pulsed using RF power to have a plurality of pulses with a duty cycle on time of less than about 20%.

Implementations, can include one or more of the following advantages. Films formed according to the methods discussed herein can have a hydrogen content of less than 10%. The systems and methods discussed herein can form films that include predetermined film properties such as the extinction coefficient, film stress, and refractive index.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While the foregoing is directed to implementations of the present disclosure, other and further implementations of the present disclosure may be devised without departing from the basic scope thereof, and the scope thereof is determined by the claims that follow.

What is claimed is:

1. A method of forming a film, comprising:
   ionizing a precursor gas to form a plasma in a process volume of a process chamber;
   pulsing an RF power source coupled to the process chamber; and
   in response to the pulsing, depositing a film on a substrate during the pulsing of the RF power source, the substrate being positioned on a substrate support inside of the process volume, wherein the substrate support is at a temperature from 350° C. to 450° C.; and
   wherein the film includes a hydrogen content below about 5% and has a variation in thickness of less than 6%.

2. The method of claim 1, wherein introducing the precursor gas comprises introducing the precursor gas via a gas distribution assembly opposite the substrate support, the gas distribution assembly being at a temperature from about 200° C. to about 350° C. during the depositing of the film.

3. The method of claim 1, further comprising depositing the film at a deposition rate from 1 A/s to 8 A/s during the pulsing of the RF power source.

4. The method of claim 1, wherein pulsing the RF power source comprises having a duty cycle on time ($T_{ON}$) of the RF power source of less than about 20%.

5. The method of claim 1, wherein the precursor gas comprises silicon (Si) or germanium (Ge).

6. The method of claim 1, wherein the precursor gas comprises hydrogen.

7. The method of claim 6, wherein the precursor gas comprises $C_2H_6$, $C_2H_2$, or $GeH_4$.

8. A method of forming a film, comprising:
   introducing a precursor gas to a process volume of a process chamber, the process chamber having a chamber lid, a chamber bottom, and a sidewall extending therebetween;
   ionizing the precursor gas to form a plasma;
   pulsing an RF power source to cause a duty cycle on time ($T_{ON}$) of a duty cycle of a pulse generated by the RF power source to be less than about 20% of a total cycle time ($T_{TOT}$) of the duty cycle; and
   depositing a film having a hydrogen content below about 5% onto a substrate positioned on a substrate support inside of the process volume, wherein the substrate support is at a temperature from 350° C. to 450° C., and wherein the thickness of the film has a variation of 6% or less.

9. The method of claim 8, wherein the duty cycle on time ($T_{ON}$) of a duty cycle of a pulse generated by the RF power source to be less than about 10% of a total cycle time ($T_{TOT}$) of the duty cycle.

10. The method of claim 8, wherein the film is deposited on at least one of the chamber lid, the chamber bottom, and the sidewall of the process chamber.

11. The method of claim 8, wherein the depositing of the film occurs at a deposition rate from about 1 Å/min to about 10 Å/min.

12. A method of forming a film, comprising:
    (a) forming a plasma in a process chamber from a film precursor;
    (b) pulsing an RF power source to cause a duty cycle on time ($T_{ON}$) of a duty cycle of a pulse generated by the RF power source to be less than about 20% of a total cycle time ($T_{TOT}$) of the duty cycle;
    (c) depositing a first film interlayer on a substrate positioned on a substrate support inside of the process chamber, wherein the substrate support is at a temperature from 350° C. to 450° C.;
    (d) subsequent to (c), purging the process chamber;
    (e) subsequent to (d), introducing a hydrogen plasma to the process chamber; and
    (f) repeating (b)-(e) to form a film including a hydrogen content below 5% and a variation in thickness less than 6%.

13. The method of claim 12, wherein the substrate comprises at least one of a lid surface of the process chamber, a bottom surface of the process chamber, a sidewall of the process chamber, or a substrate positioned on a substrate support in the process chamber.

14. The method of claim 12, wherein a film deposition rate at (c) is from about 1 Å/min to about 5 Å/min.

15. The method of claim 12, wherein a thickness of the first film interlayer is from 2 Å-50 Å.

16. The method of claim 12, wherein a thickness of the film is from about 100 Å to about 500 Å.

* * * * *